United States Patent
Bahl et al.

(10) Patent No.: US 10,806,029 B2
(45) Date of Patent: Oct. 13, 2020

(54) CATALYTIC CIRCUIT BOARD WITH TRACES AND VIAS

(71) Applicant: CATLAM LLC, Sunnyvale, CA (US)

(72) Inventors: Kenneth S. Bahl, Saratoga, CA (US); Konstantine Karavakis, Livermore, CA (US)

(73) Assignee: CATLAM, LLC, Sunnyvale, CA (US)

(*) Notice: Subject to any disclaimer, the term of this patent is extended or adjusted under 35 U.S.C. 154(b) by 0 days.

(21) Appl. No.: 16/381,823

(22) Filed: Apr. 11, 2019

(65) Prior Publication Data

US 2019/0239349 A1    Aug. 1, 2019

Related U.S. Application Data

(63) Continuation of application No. 15/878,398, filed on Jan. 23, 2018, now Pat. No. 10,306,756, and a
(Continued)

(51) Int. Cl.
*H05K 1/03*    (2006.01)
*H05K 3/18*    (2006.01)
(Continued)

(52) U.S. Cl.
CPC ......... *H05K 1/0313* (2013.01); *H05K 1/0296* (2013.01); *H05K 1/038* (2013.01); *H05K 1/0353* (2013.01); *H05K 1/0373* (2013.01); *H05K 1/09* (2013.01); *H05K 1/115* (2013.01); *H05K 3/18* (2013.01); *H05K 3/181* (2013.01); *H05K 3/182* (2013.01); *H05K 3/387* (2013.01); *H05K 3/422* (2013.01); *H05K 3/429* (2013.01); *H05K 3/4632* (2013.01); *H05K 1/0366* (2013.01);
(Continued)

(58) Field of Classification Search
CPC .... H05K 1/0353; H05K 1/036; H05K 1/0366; H05K 1/0373; H05K 3/18; H05K 3/182; H05K 3/184; H05K 3/185; H05K 3/187
See application file for complete search history.

(56) References Cited

U.S. PATENT DOCUMENTS 4,287,253 A * 9/1981 Leech ............... C23C 18/28
174/258
4,472,562 A * 9/1984 Shirahata ............ C08K 5/54
528/15

(Continued)

*Primary Examiner* — Jeremy C Norris
(74) *Attorney, Agent, or Firm* — File-EE-Patents.com; Jay A. Chesavage

(57) ABSTRACT

A catalytic resin is formed by mixing a resin and either homogeneous or heterogeneous catalytic particles, the resin infused into a woven glass fabric to form an A-stage pre-preg, the A-stage pre-preg cured into a B-stage pre-preg, thereafter held in a vacuum and between pressure plates at a gel point temperature for a duration of time sufficient for the catalytic particles to migrate away from the resin rich surfaces of the pre-preg, thereby forming a C-stage pre-preg after cooling. The C-stage pre-preg subsequently has trenches formed by removing the resin rich surface, the trenches extending into the depth of the catalytic particles, optionally including drilled holes to form vias, and the C-stage pre-preg with trenches and holes placed in an electroless bath, whereby traces form in the trenches and holes where the surface of the cured pre-preg has been removed.

29 Claims, 12 Drawing Sheets

Related U.S. Application Data continuation of application No. 15/603,326, filed on May 23, 2017, now Pat. No. 9,942,981, and a continuation of application No. 15/240,133, filed on Aug. 18, 2016, now Pat. No. 9,706,650.

(51) Int. Cl.
| | | |
|---|---|---|
| *H05K 1/02* | (2006.01) | |
| *H05K 1/09* | (2006.01) | |
| *H05K 3/42* | (2006.01) | |
| *H05K 3/46* | (2006.01) | |
| *H05K 1/11* | (2006.01) | |
| *H05K 3/38* | (2006.01) | |

(52) U.S. Cl.
CPC ............... *H05K 2201/0209* (2013.01); *H05K 2201/0227* (2013.01); *H05K 2201/0242* (2013.01); *H05K 2201/0376* (2013.01); *H05K 2203/0716* (2013.01)

(56) References Cited

U.S. PATENT DOCUMENTS

| | | | | |
|---|---|---|---|---|
| 2013/0143983 | A1* | 6/2013 | Makihara | H01L 23/291 |
| | | | | 523/438 |
| 2015/0334825 | A1* | 11/2015 | Bahl | C23C 18/204 |
| | | | | 174/251 |

\* cited by examiner

Catalytic Particle Distribution through Prepreg

Native Catalytic Pre-preg

After etch & via drill

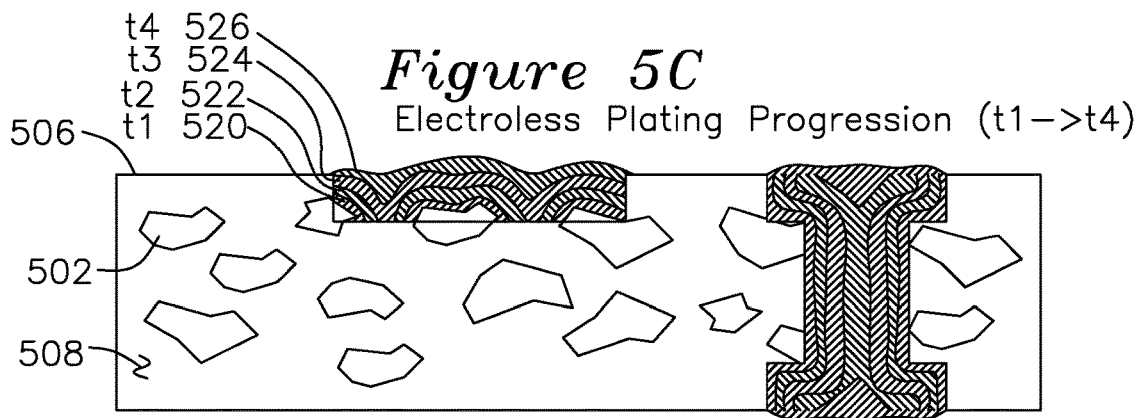
*Figure 5C*
Electroless Plating Progression (t1->t4)
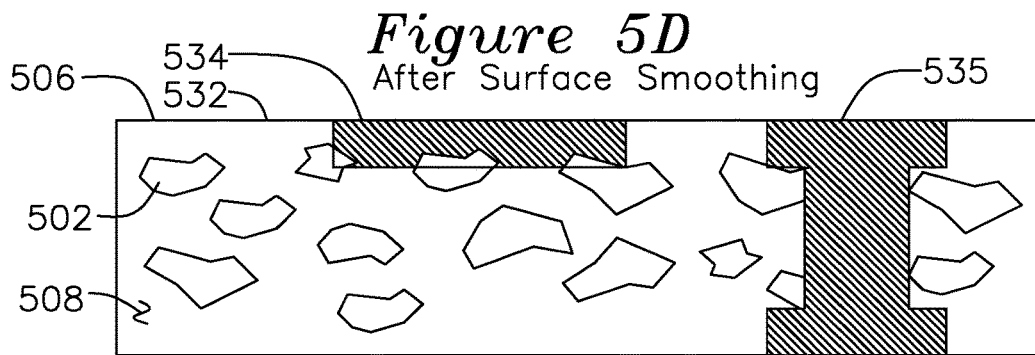
*Figure 5D*
After Surface Smoothing
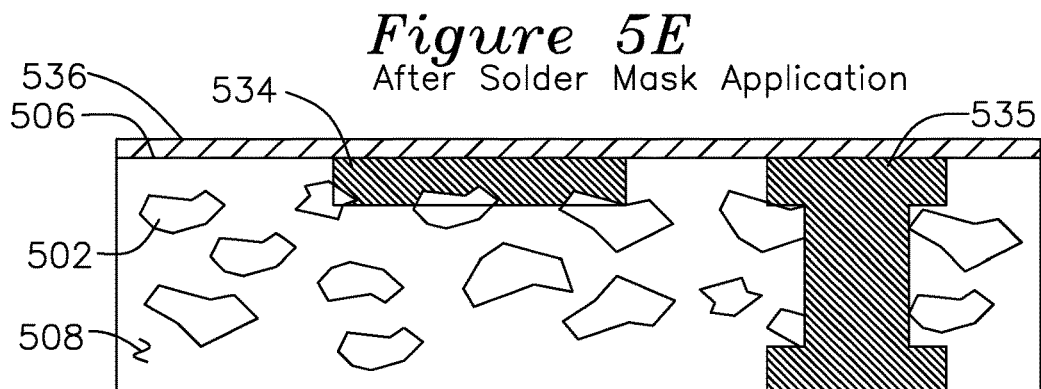
*Figure 5E*
After Solder Mask Application
*Figure 5F*
Prior Art: Etched Traces After Solder Mask Application
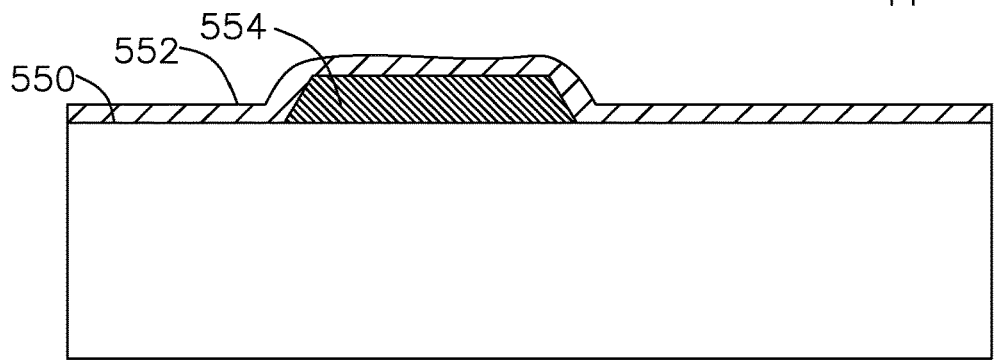

Non-Catalytic Prepreg After Catalytic Adhesive Application

After Plasma Clean

After Thincoat Electroless Plating

After plating mask step

After Copper Electroplate

After Mask Strip

After quick Etch

Non-Catalytic Prepreg with copper foil lamination

After patterning and foil etch

After hole drill/punch

After Catalytic Adhesive Fill

After secondary hole drill

After electroless Cu plate

Perspective transparent view

Non-Catalytic Prepreg w/drilled hole

After catalytic adhesive application

After secondary hole drill/punch

After surface removal

After electroless plating

Catalytic Prepreg

After catalytic adhesive application

After hole drill/punch

After surface removal

After electroless plating

CATALYTIC CIRCUIT BOARD WITH TRACES AND VIAS

The present patent application is a Continuation of U.S. Patent pending application Ser. No. 15/878,398 filed Jan. 23, 2018, which is a continuation of U.S. application Ser. No. 15/603,326 filed May 23, 2017, now issued as U.S. Pat. No. 9,942,981, which is a continuation of U.S. patent application Ser. No. 15/240,133 filed Aug. 18, 2016, now issued as U.S. Pat. No. 9,706,650.

FIELD OF THE INVENTION

The present invention relates to a catalytic laminate and its uses in circuit board fabrication. In particular, the laminate has properties which provide for fine pitch circuit interconnects which can be formed in trenches to form circuit board layers having planar surfaces with embedded conductors.

BACKGROUND OF THE INVENTION

Prior art printed circuit boards (PCB) are formed using conductive metal interconnects (known as "traces") formed on a dielectric substrate, where each surface carrying conductors is known as a "layer". Each dielectric core has traces formed on one surface or on both surfaces, and by stacking several such dielectric cores having traces formed in them interspersed with bare dielectric layers, and laminating them together under temperature and pressure, a multi-layer printed circuit may be formed. The dielectric substrate comprises an epoxy resin embedded in a fiber matrix such as glass fiber woven into a cloth. In one prior art fabrication method, copper is laminated onto the outer surfaces of a dielectric layer, the copper surfaces are patterned such as with a photoresist or photo sensitive film to create masked and unmasked regions, and then etched to form a conductive trace layer on one or both sides of the core dielectric. A stack of dielectric cores with conductive traces may then be laminated together to form multi-layer boards, and any layer interconnects made with vias, which are drilled holes plated with copper to form annular rings which provide connectivity from one layer to another.

Printed circuit boards (PCB) are typically used to provide conductive traces between various electronic components mounted on the PCB. One type of electronic component is a through-hole device which is mounted on the PCB by having leads positioned through one or more holes in the PCB, where the PCB hole includes a conductive annular ring pad on each trace connect layer, and the component lead is soldered to the annular ring pad of the PCB hole. Through hole components have leads which tend to be difficult to align with the associated PCB mounting hole, but surface mount technology (SMT) provides a preferable mounting system, where component leads are simply placed on the surface of a PCB pad and soldered, which is preferred for PCB assembly because of the higher density and ease of mechanized assembly. Surface mount components require only surface mount pads on an outside finished PCB layer. Within a two layer or multi-layer PCB, interconnects of conductive traces from one layer to another are accomplished using through-hole vias, where a conductive trace on one trace layer leads to a hole which is typically drilled through one or more dielectric layers of the PCB and plated with copper or other conductive metal to complete the trace layer connection. A hole drilled through all dielectric layers is known as a thru-via, a hole drilled through an outer layer only (typically as part of the fabrication of the individual layer) is known as a micro-via, and a hole drilled through one or more inner layers is known as a blind via. For any of these via types, the via is patterned to include an annular ring conductor region on opposite trace layers of the PCB, with the drilled hole lined with conductive material which connects the annular ring conductors on either side of the laminate or PCB.

The thickness of pre-patterned or post-patterned copper on a printed circuit board laminate may be increased using electroplating, where the PCB or dielectric layer with traces is placed in an electrolytic bath, and a DC source is connected between a sacrificial anodic conductor (such as a copper rod) to an existing conductive layer of a PCB. Where a pre-existing conductive copper layer is not present on a PCB to facilitate electroplating, such as the case of bare dielectric material or drilled via holes, a seed layer of copper must first be deposited. This is done using an electroless process with the assistance of a "seed" catalytic material (which enhances the deposition of a particular conductive material) which is deposited on the surface of the dielectric, and the board is then placed in an electroless bath. For a catalyst such as palladium and an electroless bath of copper, the copper ions in solution deposit over the palladium until the surface is covered sufficiently to provide uniform electrical conductivity, after which the copper deposited using the electroless process provides a conductive scaffold for the subsequent addition of material using the electroplating process. Electroplating is preferred for finishing the plating operation, as it has a faster deposition rate than the electroless plating process.

As electronic assemblies increase in complexity, it is desired to increase component densities on PCB assemblies, such as by using smaller trace widths (known as fine pitch traces) in conjunction with increasingly dense integrated circuit (IC) lead patterns. One problem of prior art surface mount PCB fabrication and assembly methods is that because the traces are formed on the surface of the dielectric, the adhesion between copper trace and underlying laminate for narrower conductor line widths (known as fine pitch traces) is reduced, causing the fine pitch traces and component pads to separate (lift) during a component replacement operation, ruining the entire circuit board assembly and expensive components on it. Another problem of fine pitch surface traces is that when fabricating a multi-layer circuit board, the individual trace layers are laminated together under pressure in an elevated temperature environment. During lamination, fine pitch traces tend to migrate laterally across the surface of the dielectric. In high speed circuit design, it is desired to maintain a fixed impedance between traces, particularly for differential pair (edge coupled) transmission lines. This lateral migration of traces during lamination causes the transmission line impedance of the finished PCB differential pair to vary over the length of the trace, which causes reflections and losses in the transmission line compared to one with fixed impedance characteristics resulting from constant spacing.

It is desired to provide a printed circuit board pre-preg and trace forming process which provides trace positions which remain stationary during the lamination process. It is also desired to provide dielectric and trace layers with finished planar surfaces to prevent lateral forces on traces from developing during lamination. It is also desired to provide a catalytic pre-preg for use in printed circuit processing, where the catalytic pre-preg has a catalytic-free surface and where removal of the surface of the catalytic pre-preg exposes the catalytic particles for formation of traces in areas where surface material has been removed.

Objects of the Invention

A first object of the invention is a catalytic pre-preg containing catalytic particles, where the catalytic pre-preg conceals the catalytic particles under a resin rich outer surface which does not expose the catalytic particles unless the outer surface of the catalytic pre-preg has been removed, where the surface removal may be accomplished using any of laser cutting, mechanical abrasion, mechanical cutting, chemical or plasma etching, or any other means which removes the outer surface of the pre-preg and exposes the underlying catalytic particles below the surface of the pre-preg.

A second object of the invention is a method for manufacture of a catalytic pre-preg which has a resin rich outer surface which does not contain exposed catalytic particles and a catalyst rich layer below the resin rich outer surface, where the catalytic pre-preg is formed using a process having the steps:

a fiber infusion step wherein a fiber cloth is infused with a catalytic resin formed from blending a resin with catalytic particles;

a vacuum compression step performed at elevated temperature whereby the outer surfaces of the fiber cloth infused with catalytic resin are subjected to externally applied pressure in an ambient vacuum condition during a temperature ramp time;

a gel point step whereby the applied pressure remains on the outer surfaces of the fiber cloth infused with catalytic resin to maintain a liquid/solid equilibrium for a duration of time sufficient for the catalytic particles to be drawn away from the outside surfaces;

a dwell temp whereby an elevated temperature is applied to the laminate for a dwell time duration at a gel point temperature;

a cooling step whereby the fiber cloth infused with catalytic resin is cooled into substantially planar sheets.

SUMMARY OF THE INVENTION

In a first embodiment of the invention, a catalytic pre-preg is formed by blending a resin, volatile solvent, and catalytic particles to form a catalytic resin mixture, infusing the catalytic resin into a fiber fabric such as woven glass fiber or other fabric to form an "A-Stage" catalytic pre-preg, baking the fiber and resin together at elevated temperature to remove most of the volatile solvent and form a partially cured "B-Stage" catalytic pre-preg such as in sheet form, thereafter placing the B-stage pre-preg into a lamination press, heating the B-stage pre-preg at a gel point such that the pre-preg is in a liquid/solid equilibrium, thereafter curing the pre-preg at an elevated temperature and pressure for a dwell time sufficient for the catalytic particles to migrate away from the outer surfaces of the pre-preg and to form a finished "C-stage" pre-preg with a resin-rich surface which is free from exposed surface catalytic particles. The mechanical removal of this resin rich surface thereby exposes the underlying catalytic particles, forming a surface suitable for electroless plating using copper ions in solution, or any suitable electroless plating metal ions in solution.

In a second embodiment of the invention, a single or multi-layer PCB is formed by patterning an exposed surface onto a catalytic pre-preg having a resin rich surface which excludes catalytic particles from the surface, where the catalytic particles are distributed below the resin rich surface and are not exposed. In a first step, the catalytic particles are exposed by removing the surface of the material using any removal means, including laser ablation, plasma etching, chemical etching, mechanical abrasion or cutting, using any of these techniques with or without a pattern mask. In a second step, the catalytic laminate is placed in an electroless plating bath, where the metal of the electroless plating (such as Cu) is attracted to, and bonds to, the exposed catalytic particles (such as Pt) in the patterned regions where the resin rich surface has been removed. The second step continues until the electroless plating fills the sides and bottom of the patterned trench with plated metal to the surrounding native surface level of the catalytic laminate. In an optional third step, the surface of the patterned trench is planarized, such as by polishing, grinding, machining, or etching, to match the level of the electroless plating level to the surrounding native surface of the catalytic laminate. In an optional third or fourth step, soldermask is applied to cover regions of the catalytic laminate and regions of the patterned traces.

In a third embodiment of the invention, the catalytic pre-preg of the first embodiment has holes formed through drilling or ablation or other means of removing material to create an aperture in the catalytic pre-preg, the aperture adjacent to a pad region where the surface of the catalytic pre-preg is removed adjacent to the aperture, thereby exposing underlying catalytic particles of the catalytic pre-preg in the inner surfaces of the aperture and also the outer surfaces of the catalytic pre-preg, which is next plated into an electroless plating bath. The resulting catalytic pre-preg thereafter forms a conductive surface trace which is electrically connected to a conductive via, which may optionally form a component mounting pad. The via may also include a conductive surface trace on the opposite side of the catalytic pre-preg, where the first surface trace, via, and second surface trace were all created in a single electroless plating step. After electroless plating, the outer surfaces of the catalytic laminate may be planarized such that the conductive traces are planar with the native surface of the catalytic laminate, such that individual layers of catalytic laminate with traces formed may be stacked and laminated into a multi-layer PCB.

In a fourth embodiment of the invention using a conventional non-catalytic pre-preg, a single or multi-layer PCB is formed by a process having a first step of applying a catalytic adhesive to one or both sides of the non-catalytic pre-preg, where the catalytic adhesive includes a resin mixed with catalytic particles and forms a catalytic adhesive layer over the non-catalytic pre-preg. In a second step, the catalytic pre-preg surface layer is selectively partially removed such as by using a plasma cleaning or plasma etching process for a duration of time sufficient to expose the catalytic particles while leaving the underlying adhesive resin which secures the catalytic particles to the non-catalytic pre-preg. In a third step, the partially removed or etched catalytic adhesive is exposed to electroless plating using metal ions in solution which bind to the catalytic particles, which is performed until a substantially continuous conductive layer of metal is deposited. In a fourth step, a pattern mask is applied which provides open areas where traces are desired. In a fifth step, the continuous conductive layer is used as an electrode for electroplating in a metallic bath such that metallic ions in solution electro-deposit onto the patterned exposed conductive layers formed in the third step electroless deposition. In a sixth step, the pattern mask is stripped, and in a seventh step, a quick etch is performed for a sufficient time to remove the electroless plating in previously unexposed areas under the pattern mask.

In a fifth embodiment of the invention, a conductive via is formed in a non-catalytic laminate by forming a first aperture in the non-catalytic laminate, optionally adjacent to a first pad or second pad formed from a conductor on a first surface or second surface of the non-catalytic laminate, filling the first aperture with a catalytic resin or catalytic adhesive, allowing the catalytic resin or adhesive to cure, drilling a second hole in the first aperture which is smaller in diameter than the aperture, and electroless plating the second hole and surrounding pad, thereby forming a connection from the inner surface of the second hole to the first pad or second pad.

In a sixth embodiment of the invention, a non-catalytic laminate has a catalytic adhesive applied, the catalytic adhesive comprising a resin and catalytic particles, the catalytic adhesive having a thickness of at least two times greater than the largest catalytic particles in the adhesive, the catalytic adhesive curing and developing a resin rich surface and an exclusion zone below the resin rich surface where the catalytic particles are excluded, the removal of the resin rich surface providing exposed catalytic particles suitable for electroless plating, the non-catalytic laminate optionally also having holes which may be filled with catalytic adhesive and drilled to provide exposed catalytic particles for electroless plating of the drilled holes along with conductive traces formed by electroless copper deposition.

In a seventh embodiment of the invention, a catalytic laminate has a catalytic adhesive applied to at least one surface, the catalytic laminate comprising a pre-preg with catalytic particles, the adhesive comprising a resin and catalytic particles, the catalytic adhesive and catalytic laminate drilled to form through holes, traces patterned on the surface of the catalytic adhesive by removing the surface layer of the catalytic adhesive, thereafter forming traces by electroless plating on the patterned traces, thereafter planarizing the at least one surface.

BRIEF DESCRIPTION OF THE DRAWINGS

FIG. 5C shows a section view of catalytic pre-preg during an electroless plating step during a time sequence.

FIG. 5D shows a section view of catalytic pre-preg after a surface smoothing step.

FIG. 5E shows a section view of catalytic pre-preg after a solder mask step.

FIG. 5F shows a section view of a prior art etched copper trace on a non-catalytic pre-preg.

DETAILED DESCRIPTION OF THE INVENTION

Figure 1A:
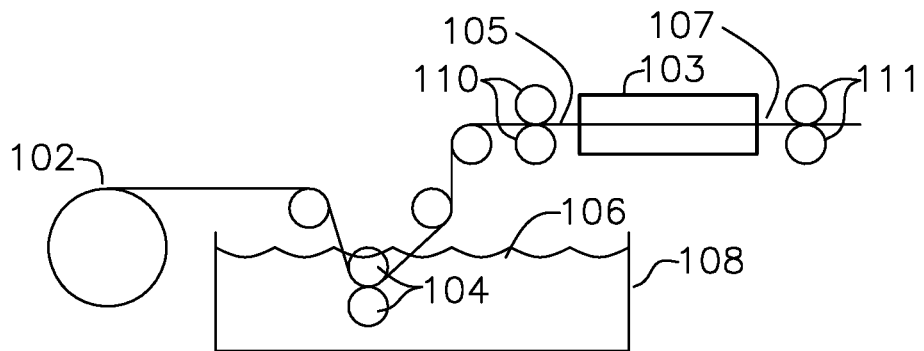
FIG. 1A shows a schematic view of a process for forming a raw catalytic pre-preg.

FIG. 1A shows an example process for fabricating pre-preg (a matrix of pre-impregnated fibers bound in resin). Many different materials may be used for the fibers of pre-preg, including woven glass-fiber cloth, carbon-fiber, or other fibers, and a variety of different materials may be used for the resin, including epoxy resin, polyimide resin, cyanate ester resin, PTFE (Teflon) blend resin, or other resins. One aspect of the invention is a printed circuit board laminate capable of supporting fine pitch conductive traces on the order of 1 mil (25 u), and while the description is drawn to the formation of copper traces using catalysts for electroless copper formation, it is understood that the scope of the invention may be extended to other metals suitable for electroless plating and electro-plating. For electroless deposition of copper (Cu) channels, elemental palladium (Pd) is preferred as the catalyst, although selected periodic table transition metal elements, such as group 9 to 11 platinum (Pt), rhodium (Rh), iridium (Ir), nickel (Ni), gold (Au), silver (Ag), cobalt (Co), or copper (Cu), or other compounds of these, including other metals such as iron (Fe), manganese (Mn), chromium (Cr), molybdenum (Mo), tungsten (W), titanium (Ti), tin (Sn), or mixtures or salts of the above, any of which may be used as catalytic particles. The present candidate list is intended to be exemplar rather than comprehensive, it is known in the art that other catalysts for attracting copper ions may also be used. In one example of the invention, the catalytic particles are homogeneous catalytic particles. In another example of the invention, the catalytic particles are inorganic particles or high temperature resistant plastic particles which are coated with a few angstrom thickness of catalytic metal, thereby forming heterogeneous catalytic particles having a thin catalytic outer surface encapsulating a non-catalytic inner particle. This formulation may be desirable for larger catalytic particles, such as those on the order of 25 u in longest dimension. The heterogeneous catalytic particle of this formulation can comprise an inorganic, organic, or inert filler such as silicon dioxide ($SiO_2$), an inorganic clay such as Kaolin, or a high temperature plastic filler coated on the surface with a catalyst such as palladium adsorbed onto the surface of the filler, such as by vapor deposition or chemical deposition. Only a few atomic layers of catalyst are required for the catalytic particle to have desirable properties conducive to electroless plating.

In one example of forming heterogeneous catalytic particles, a bath of fillers (organic or inorganic) is sorted by size to include particles less than 25 u in size, these sorted inorganic particles are mixed into an aqueous bath in a tank, agitated, and then a palladium salt such as PdCl (or any other catalyst such as a salt of silver of other catalyst) is introduced with an acid such as HCl, and with a reducing agent such as hydrazine hydrate, the mixture thereby reducing metallic Pd which coats the inorganic particles provide a few angstroms of thickness of Pd coated on the filler, thereby creating a heterogeneous catalytic particle which has the catalytic property of a homogeneous Pd particle with a greatly reduced volume requirement of Pd compared to using homogeneous Pd metallic particles. For extremely small catalytic particles on the order of a few nm, however, homogeneous catalytic particles (such as pure Pd) may be preferred.

Example inorganic fillers include clay minerals such as hydrous aluminum phyllosilicates, which may contain variable amounts of iron, magnesium, alkali metals, alkaline earths, and other cations. This family of example inorganic fillers includes silicon dioxide, aluminum silicate, kaolinite ($Al_2Si_2O_5(OH)_4$), polysilicate, or other clay minerals which belong to the kaolin or china clay family. Example organic fillers include PTFE (Teflon) and other polymers with high temperature resistance.

Examples of palladium salts are: BrPd, $CL_2Pd$, $Pd(CN)_2$, $I_2Pd$, $Pd(NO_3)_2*2H_2O$, $Pd(NO_3)_2$, $PdSO_4$, $Pd(NH_3)4Br_2$, $Pd(NH_3)4Cl_2H_2O$. The catalytic powder of the present invention may also contain a mixture of heterogeneous catalytic particles (for example, catalytic materials coated over inorganic filler particles), homogeneous catalytic particles (such as elemental palladium), as well as non-catalytic particles (selected from the family of inorganic fillers).

Among the catalysts, palladium is a preferred catalyst because of comparative economy, availability, and mechanical properties, but other catalysts may be used.

FIG. 1A shows a roll of fabric cloth 102 such as woven glass fiber is fed through as set of rollers which guide the fabric into tank 108 which is filled with an epoxy resin blended with catalytic particles and mixed with a volatile liquid to reduce the viscosity, thereby forming an A-stage (liquid) pre-preg.

The resin may be a polyimide resin, a blend of epoxy and cyanide ester (which provides curing at elevated temperatures), or any other suitable resin formulation with selectable viscosity during coating and thermosetting properties after cooling. Fire retardants may be added, for example to comply with a flammability standard, or to be compatible with one of the standard FR series of pre-preg such as FR-4 or FR-10. An additional requirement for high speed electrical circuits is dielectric constant $\varepsilon$ (permittivity), which is often approximately 4 and governs the characteristic impedance of a transmission line formed on the dielectric, and loss tangent $\delta$, which is measure of frequency-dependent energy absorption over a distance, whereby the loss tangent is a measure of how the dielectric interacts with high frequency electric fields to undesirably reduce signal amplitude by a calculable amount of dB per cm of transmission line length. The resin is blended with catalytic particles which have been sorted for size. In one example formulation, the catalytic particles include at least one of: homogeneous catalytic particles (metallic palladium), or heterogeneous catalytic particles (palladium coated over an inorganic particle or high temperature plastic), and for either formulation, the catalytic particles preferably having a maximum extent of less than 25 u and with 50% of the particles by count sized between 12 u and 25 u, or the range 1-25 u, or smaller. These are example catalytic particle size embodiments not intended to limit the scope of the invention. In one example embodiment, the catalytic particles (either homogeneous or heterogeneous) are in the size range 1 u-25 u. In another example of the invention, homogeneous catalytic particles are formed by grinding metallic palladium into particles and passing the resultant particles through a sieve with a mesh having 25 u rectangular openings. In another example, the catalytic resin mixture 106 is formed by blending homogeneous or heterogeneous catalytic particles into the pre-preg resin by a ratio of weights, such as the ratio of substantially 12% catalytic particles by weight to the weight of resin. The ratio by weight of catalytic particles in the resin mixture may alternatively be in the range of 8-16% of catalytic particle weight to the total weight of resin. It is understood that other blending ratios may also be used, and it may be preferable to use smaller particles. In one example of the invention, the catalytic particle density is chosen to provide a mean distance between catalytic particles on the order of 3 u-5 u.

Figure 1B:
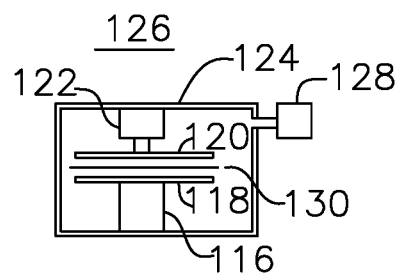
FIG. 1B shows a vacuum lamination press for forming a finished catalytic pre-preg from a raw catalytic pre-preg.

After the fabric is immersed into the catalytic resin bath 106 with rollers 104, the catalytic resin impregnated cloth is guided to rollers 110, which establish the thickness of the uncured liquid A-stage pre-preg 105 which also establishes the percentage of resin in the resin/glass+resin ratio. The A-stage pre-preg 105 is then passed through a baking oven 103 which drives out the organics and other volatile compounds of the A-stage pre-preg and greatly reduces the liquid content, forming tack-free B-stage pre-preg 107 delivered by rollers 111. In an example embodiment, oven 103 dries the volatile compounds from an about 80% solvent ratio of A-stage pre-preg to less than about 0.1% solvent ratio for B-stage pre-preg. The resulting B-stage pre-preg 107 is provided to material handling 111 and can be cut into sheets for ease of handling and storage, and is later placed into the lamination press 126 of FIG. 1B which applies pressure across the surface of the sheets under vacuum, changing the temperature profile while the pre-preg core is in the lamination press, following the temperature plot 202 shown in FIG. 2. In one example of the invention, to create the resin rich surface, the pre-preg sheets positioned near the outer surfaces (which will later have the surface removed to expose the underlying catalytic particles) are selected to have greater than 65% resin, such as Glass 106 (71% resin), Glass 1067, or Glass 1035 (65% resin), and the inner pre-preg sheets (which are not subject to surface removal) are selected to have less than 65% resin. Additionally, to reduce the likelihood of fiberglass being present near the surface of the catalytic pre-preg, a woven fiberglass may be used with the inner pre-preg layers and a flat unwoven fiberglass may be used in the outer resin rich pre-preg layers. The combination of resin-rich pre-preg and flat unwoven fiberglass on the outer surface layer results in an exclusion zone of 0.7 mil (17 u) to 0.9 mil (23 u) between an outer surface and the encapsulated fiberglass. Glass styles 106, 1035, and 1067 are preferred for use on the outer resin rich surface since the glass fiber thicknesses are smaller (1.3-1.4 mil/33-35 u) than the glass fiber thickness found in typical pre-preg sheets with greater than 65% resin used in the central regions of the laminate, such as glass style 2116, which has 3.7 mil (94 u) fibers. These values are given as examples, the smallest glass fibers which are commercially available are expected to continue to reduce in diameter. The temperature vs. time plot 202 is tailored in the present invention to cause the catalytic particles and fiberglass to migrate away from the outer surface of the laminate, repelled by the surface tension of the epoxy during a liquid state of the gel point temperature. After the cooling cycle of plot 202, the cured C-stage pre-preg sheets are offloaded 114. The process which forms the cured C-stage pre-preg sheets may use single or multiple sheets of fiber fabric to vary the finished thickness, which may vary from 2 mil (51 u) to 60 mil (1.5 mm).

Figure 3:
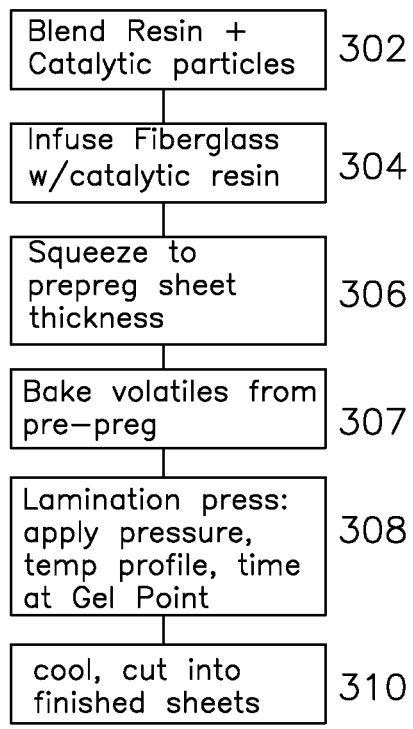
FIG. 3 shows process steps for formation of a catalytic pre-preg.

FIG. 3 shows a flowchart for the process of making pre-preg laminate with catalytic particles infused but excluded from the outer surface of the pre-preg. Step 302 is the blending of catalytic particles into the resin, often with an organic volatile added to lower the mixture viscosity, which forms the catalytic resin 106 placed in reservoir 108. Step 304 is the infusion of catalytic resin into the fabric such as rollers 104 of FIG. 1 may provide to form A-stage pre-preg, and step 306 is the initial rolling of catalytic resin infused fabric into B-stage pre-preg such as by rollers 110, step 307 is a baking step for removing organic solvents to form B-stage pre-preg, and step 308 is the pressing of catalytic resin infused fabric 130 into sheets of catalytic C-stage pre-preg in lamination press 126, which follows the temperature cycle of plot 202, with vacuum pump 128 evacuating chamber 124 throughout the lamination process to remove air bubbles from the epoxy and reduce any air voids that may form in the epoxy. The cooled finished catalytic C-stage pre-preg sheets are cut and stored for later use.

Figure 2:
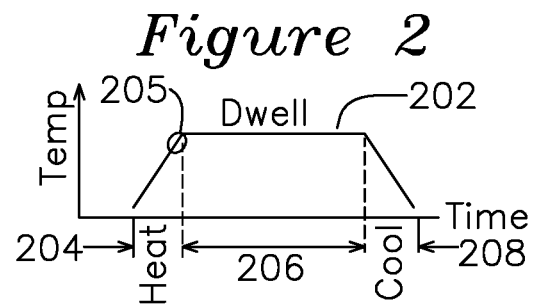
FIG. 2 shows processing times for a vacuum lamination step of FIG. 1.

The FIG. 2 plot 202 of temperature vs. time shows the temperature profile of the pre-preg in the lamination press 112, which is critical for the formation of a catalytic pre-preg which has surface property of catalytic particles being excluded from the outer resin rich surface, but which are present just below the outer resin rich surface. The resin is in liquid state in reservoir 108, and the pre-preg is in in an A-stage after the resin is impregnated into the fiberglass and passes through rollers 110. The pre-preg is in a B-stage after baking 103 where the volatile organics are baked off accompanied by an initial resin hardening, which converts the B-stage pre-preg into becomes C-stage pre-preg at the end of the lamination cycle, such as the cooling phase of FIG. 2. The B-stage pre-preg is placed into the lamination press and a vacuum is pulled to prevent trapped air from forming between lamination layers. Heat is applied during a temperature ramp-up time 204 to achieve a temperature and pressure determined pre-preg gel point 205 for a duration on the order of 10-15 seconds (the gel point defined as the state where the liquid and solid states are close to equilibrium with each other), which is critical to the process of migrating the catalytic particles away from the surface, after which the temperature of the pre-preg is maintained at the dwell temperature and dwell time 206 which may be in the range of 60-90 minutes, followed by a cooling cycle 208. The dwell temperature and gel point temperature are pressure and resin dependent, in the example range of 120 C (for epoxy) to 350 C (for Teflon/polyimide resins). Maintaining the pre-preg at the gel point 205 for too short of a duration will result in the catalytic particles or fiberglass being undesirably present at the surface of the finished pre-preg.

Figure 1C:
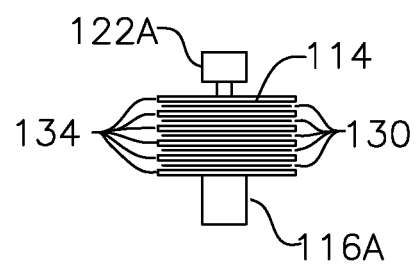
FIG. 1C shows a vacuum lamination stage to for forming multiple layers of catalytic pre-preg during a lamination.
Figure 4:
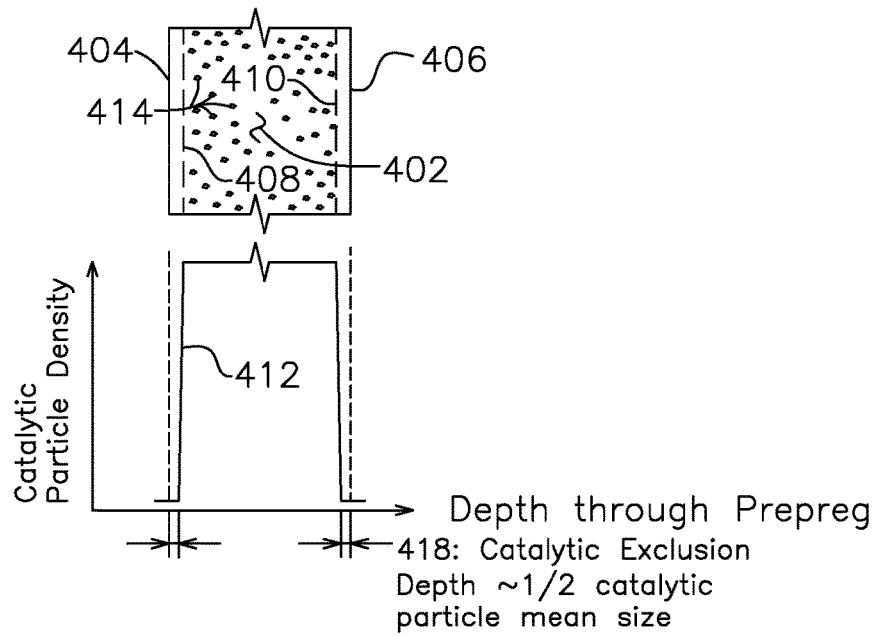
FIG. 4 shows a plot of catalytic particle distribution in a pre-preg material with respect to a section view of the pre-preg material.

FIG. 4 shows the resultant catalytic pre-preg 402 formed by the process of FIGS. 1, 2, and 3, where the catalytic particles 414 are distributed uniformly within the central region of pre-preg 402, but are not present below a boundary region 408 below first surface 404, or below boundary region 410 below second surface 406. For the example particle distribution of particles smaller than 25 u, the catalytic particle boundary is typically 10-12 u below the surface (on the order of half of the particle size), accordingly this depth or greater of surface material must be removed for the embedded catalytic particles to be available for electroless plating.

Prior art catalytic laminates have activated surfaces that must be masked to prevent unwanted electroless plating on the activated surface of the catalytic laminate. By contrast, the catalytic laminate of the present invention excludes catalytic particles over the thickness extent from first surface 404 to first boundary 408, and from second surface 406 to second boundary 410, providing the benefit that a separate mask layer preventing contact with the catalytic particles is not required for electroless plating as it is in the prior art. Accordingly, removal of surface material from either first surface 404 to the depth of boundary layer 408 or deeper, or removal of surface material from second surface 406 to second boundary 410, results in the exposure of catalytic material which may be used for electroless plating. It is also desirable for the process which provides the resin rich surface to also exclude not only catalyst, but the fiber fabric, as removal of the surface layer in subsequent steps which results in the exposure of fibers requires additional cleaning steps, accordingly it is preferred that the surface removal be of resin only, so as to expose the underlying catalytic particles. This is accomplished by using a combination of resin-rich outer pre-preg layers and flat unwoven fiberglass layers having smaller diameter fibers on the outside layers. An additional advantage of forming traces in channels using electroless plating is that the traces are mechanically supported on three sides, which provides greatly improved trace adhesion to the dielectric laminate.

Figure 5A:
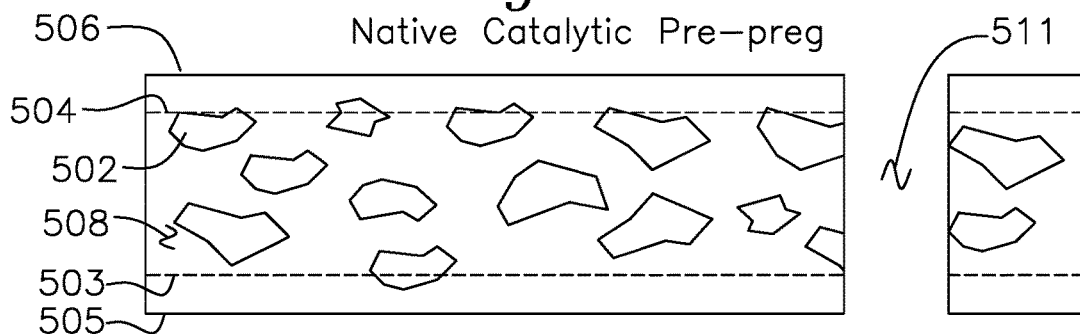
FIG. 5A shows a section view of native catalytic pre-preg.

The sequence of FIGS. 5A to 5E show the process steps, identifying various structures, but are not to scale, and provide only a simplified view of the process steps for understanding the invention. FIG. 5A shows a magnified cross section view of catalytic pre-preg 508 formed by the process of FIGS. 1, 2, and 3. Catalytic particles 502 may be in the size range of 25 u and smaller, in the present example they are shown in the range 12 u to 25 u for clarity. The catalytic particles may include heterogeneous catalytic particles (organic or inorganic particles having a catalytic surface coating) or homogeneous particles (catalytic metal particles), as described previously. The first boundary 504 is substantially 25 u below the first surface 506. The second surface 505 and second surface boundary 503 on the opposite surface are shown for reference, but may be formed in the same manner as described for the sequence of FIGS. 5A to 5E. A drilled hole 511 which will provide connectivity between traces on the first layer 506 and traces on the second layer 505 is also shown.

Figure 5B:
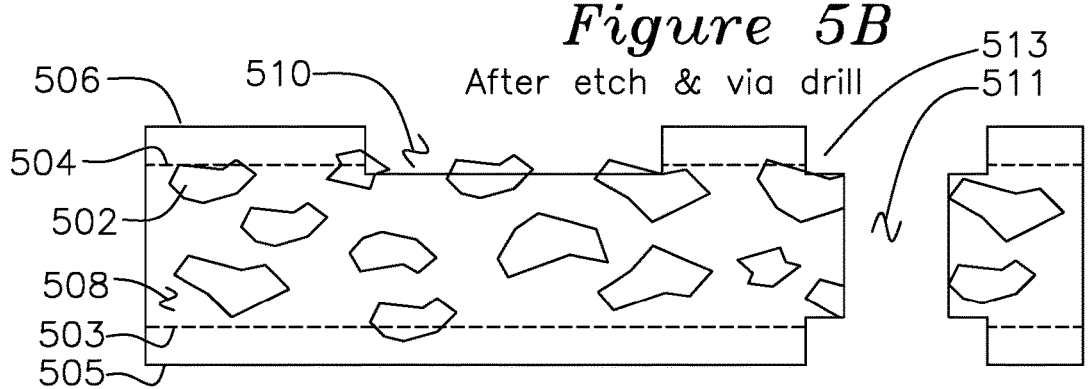
FIG. 5B shows a section view of catalytic pre-preg after a surface removal step.

FIG. 5B shows the laminate of FIG. 5A with a channel 510 formed by removal of the surface layer 506 in a region where a trace is desired. Pre-preg is also removed in an annular ring 513 of surrounding the via, at the same or different depth as the trace channel 510. The removal of surface material may be by laser ablation, where the temperature of the catalytic pre-preg is instantly elevated until the catalytic pre-preg is vaporized, while leaving the surrounding pre-preg structurally unchanged, leaving the catalytic particles exposed. It may be preferable to use a laser with a wavelength with a low reflectivity and high absorption of this optical wavelength for the pre-preg material being ablated, such as ultraviolet (UV) wavelengths. Examples of such UV lasers are the UV excimer laser or yttrium-aluminum-garnet (YAG) laser, which are also good choices because of the narrow beam extent and high available power which for forming channels of precise mechanical depth and with well-defined sidewalls. An example laser may remove material in a 0.9-1.1 mil (23 u to 28 u) diameter width with a depth governed by laser power and speed of movement across the surface. Another surface removal technique for forming channel 510 and annular ring 513 is plasma etching, which may be done locally or by preparing the surface with a patterned mask which excludes the plasma from the surface layers 506 or 505, such as a dry film photoresist or other mask material which has a low etch rate compared to the etch rate of catalytic pre-preg. The photoresist thickness is typically chosen based on epoxy/photoresist etch selectivity (such that plasma etch to the desired depth of removal of the cured epoxy leaves sufficient photoresist at the end of the etch), or in the case of photoresist which is used as an electroplate mask, the thickness is chosen according to desired deposition thickness. Typical dry film thickness is in the range of 0.8-2.5 mil (20-64 u). Plasmas suitable for etching the resin rich surface include mixtures of oxygen (O) and $CF_4$ plasmas, mixed with inert gasses such as nitrogen (N), or argon (Ar) may be added as carrier gasses for the reactive gases. A mask pattern may also be formed with a dry film mask, metal mask, or any other type of mask having apertures. Where a mechanical mask is used, the etch resist may be applied using any of photolithography, screen printing, stenciling, squeegee, or any method of application of etch resist. Another method for removal of the surface layer of pre-preg is mechanical grinding, such as a linear or rotational cutting tool. In this example, the pre-preg may be secured in a vacuum plate chuck, and a rotating cutter (or fixed cutter with movable vacuum plate) may travel a pattern defining the traces such as defined by x,y coordinate pairs of a Gerber format photofile. In another example of removing surface material, a water cutting tool may be used, where a water jet with abrasive particles entrained in the stream may impinge on the surface, thereby removing material below the first boundary 504. Any of these methods may be used separately or in combination to remove surface material and form channel 510 from pre-preg 508, preferably with the channel extending below the first boundary 504. Accordingly, the minimum channel depth is the depth required to expose the underlying catalytic particles, which is a characteristic of the cured pre-preg. As the catalytic material is dispersed uniformly through the cured pre-preg below the exclusion boundary 504, the maximum channel depth is limited by the depth of the woven fiber (such as fiberglass) fabric, which tends to complicate channel cleaning, as the fibers may break off and re-deposit in channels intended for electroless plating, or otherwise interfere with subsequent process steps. Typical channel depths are 1 mil (25 u) to 2 mil (70 u). The final step after removing the surface material to form the channel 510 is to clean away any particles of material which were removed, which may be accomplished using ultrasound cleaning, jets of water mixed with surfactant, or any other cleaning means which does not result in surface 506 material surrounding the channel from being removed.

FIG. 5C shows contour plots for progress of electroless plating over time, where the catalytic pre-preg of FIG. 5B is placed into an electroless bath using a dissolved reducing agent to reduce the metal ions to the metallic state on the catalytic pre-preg. One example electroless copper bath formulation uses a mixture of Rochelle salt as the complexing agent, copper sulfate as the copper metal source, formaldehyde as the reducing agent, and sodium hydroxide as a reactant. In this example, the tartrate (Rochelle salt) bath is preferred for ease of waste treatment; the Rochelle salt does not chelate as strongly as alternatives such as EDTA or quadrol. In this example, the tartrate (Rochelle salt) is the completing agent, copper sulfate is the metal source, formaldehyde is the reducing agent, and sodium hydroxide is a reactant. Other electroless plating formulations are possible, this example is given for reference. The electroless plating initially forms over the surfaces of the exposed catalytic particles, as shown in the hatch pattern 520 at time t1 and the matching hatch patterns in via 535. The copper deposition progresses as the electroless plating continues to the hashed regions of deposition shown for subsequent times t2 522, t3 524, and t4 526, at which time the deposition 526 may extend above the surface 506 and the via 535 is also filled with copper.

A key advantage of electroless plating with channels etched in catalytic material is that the electroless plating progresses on all three sides at once, compared to electroplating which only progresses from the bottom (initially plated) layer.

FIG. 5D shows the result of a surface smoothing operation, where the finished electroless plated trace 534 and via 535 are co-planar with surface 532. Surface smoothing may be accomplished many different ways, for example using a 420 to 1200 grit abrasive applied on a planar surface with mild pressure and linear or rotational agitation between the board and planar surface to provide a grinding operation. Other methods for planarizing the surface may be used, including milling or machining using chemical processes, mechanical processes, or other methods for forming a planar surface. FIG. 5E shows a soldermask layer 536 which may be silkscreened over the trace 534 for isolation and protection, such as a finished outer layer of a multi-layer board.

FIG. 5F shows a prior art etched copper trace for comparison purposes. Trace 554 is formed using a prior art subtractive etching process, where trace 554 is what remains after etching the rest of the copper which was present on a surface layer on non-catalytic pre-preg 550. The copper outer layer was patterned with a photoresist such as dry film and subsequently surface etched, which creates the trapezoidal section profile of trace 554 because the top of the trace experiences greater lateral etching than the bottom of the trace adjacent to the non-catalytic pre-preg 550. Another advantage of an additive process of the present invention is that for traces formed using a prior art process which etches all of the copper except the desired trace copper, surface contaminates on the surface cause adjacent trace shorting, as a copper bridge remains where the contamination was present on the surface of the copper, which does not occur in additive electroless plating of the present invention. For comparison with figure of the present invention, soldermask 552 is also shown. As seen in the figure, trace 554 is only supported by adhesion to substrate 550, whereas FIG. 5E trace 534 is supported on three sides, and is locked into its associated channel in the catalytic pre-preg 508.

Figure 6A:
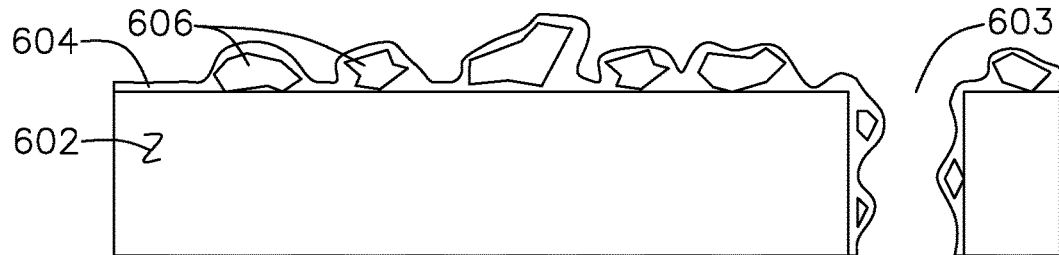
FIG. 6A shows a section view of a catalytic adhesive applied to a non-catalytic pre-preg.

FIGS. 6A to 6G show another embodiment of the invention using non-catalyst pre-preg 602, which may be a conventional pre-preg which does not contain catalytic particles. In this example of FIG. 6A, via hole 603 is first punched or drilled into the non-catalytic pre-preg 602. A catalytic adhesive is formulated by mixing a resin and catalytic particles, which may be in the same proportions and manner as the catalytic resin previous described (although it may have a higher viscosity for certain surface coating applications such as by squeegee), with the primary distinction being that the catalytic adhesive is applied to a (typically) non-catalytic substrate, although it may also be applied to a catalytic substrate. For use in a catalytic adhesive, the catalytic particles are agitated until sufficiently wetted such that the catalytic adhesive 604 ensures that the catalytic particles 606 are not exposed until a subsequent surface coating 604 removal operation such as the plasma clean of FIG. 6B. In the present example, the catalytic resin is sprayed or squeegeed onto the surface of non-catalytic pre-preg 602 and into the via hole 603, as shown in FIG. 6A. The catalytic adhesive comprises a resin 604 containing a distribution of catalytic particles 604, such as palladium particles smaller than 25 u, or, in one example of the invention, with 50% of the particles by number falling in the range of 12-25 u in longest particle dimension, or with a range of particles from 1-25 u as possible examples. The catalytic adhesive may be formed as was previously described for the catalytic resin using the ratio of 8-16% catalyst weight to resin weight, with 12% the preferred value. The resulting catalytic adhesive may be applied to the non-catalytic substrate and both baked to cure the catalytic adhesive to the non-catalytic pre-preg substrate 602. In one application method, the catalytic adhesive is applied to the leading edge of a mechanized squeegee comprising a flexible blade carrying the catalytic adhesive and passing over the surface of non-catalytic laminate, with the pressure and spacing between the flexible blade and the non-catalytic laminate adjusted such that any drilled holes are filled with catalytic laminate and a desired thickness of catalytic laminate is uniformly disposed on the surface of the non-catalytic laminate in a single pass of the squeegee. A typical catalytic adhesive thickness is 12-75 u thick. The catalytic adhesive thickness should be at least 2x thicker than the largest catalytic particles, to ensure that the catalytic particle remains below the surface of the catalytic adhesive.

Figure 6B:
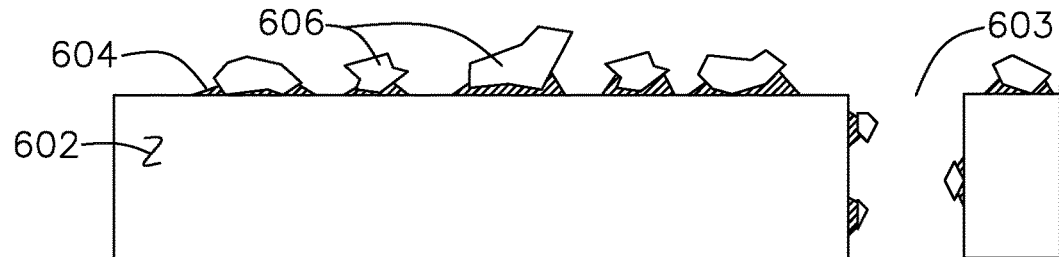
FIG. 6B shows a section view of FIG. 6A after a plasma etch step.
Figure 6C:
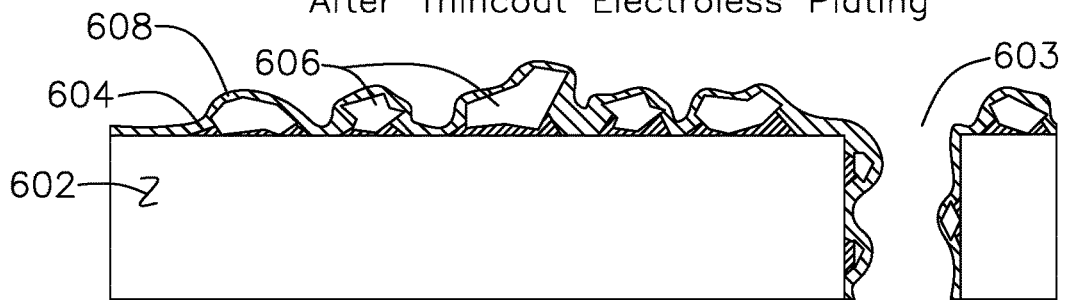
FIG. 6C shows a section view of electroless plating over a pre-preg substrate.
Figure 6D:
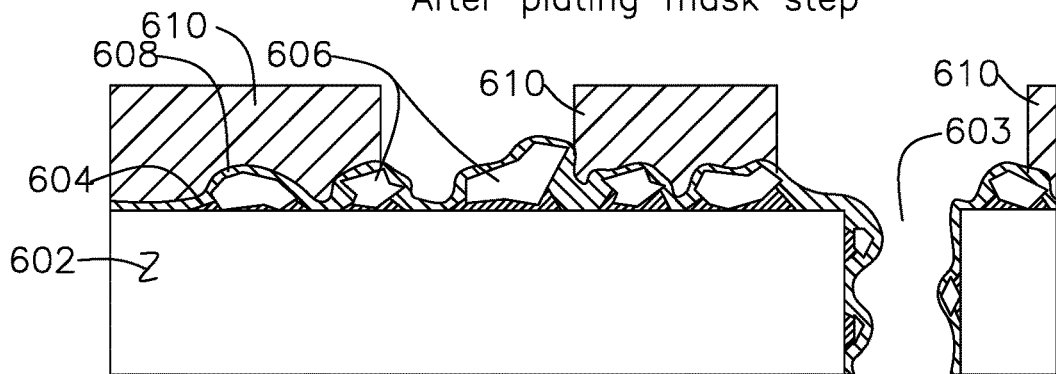
FIG. 6D shows a section view of masking material patterned over a pre-preg substrate.
Figure 6E:
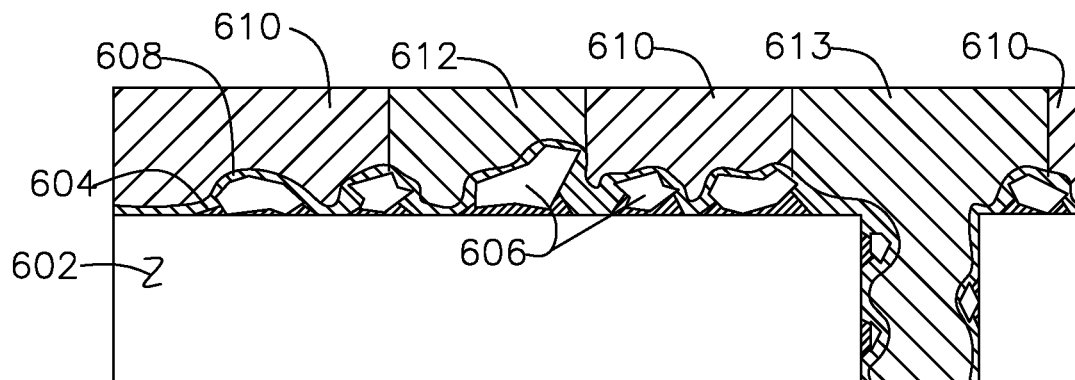
FIG. 6E shows a section view of copper electroplate over a pre-preg substrate.
Figure 6F:
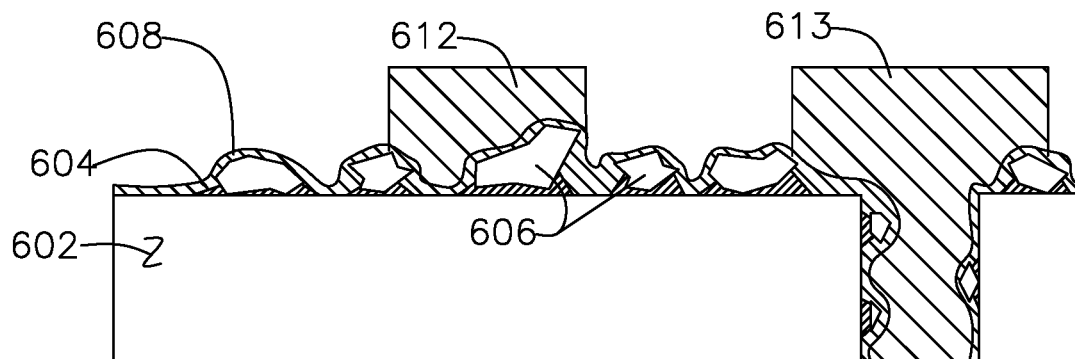
FIG. 6F shows a section view of copper electroplate after stripping a mask.
Figure 6G:
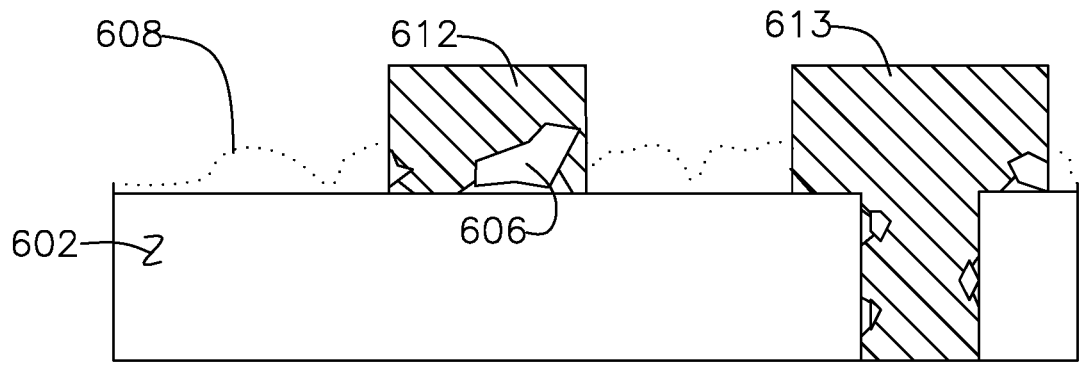
FIG. 6G shows a section view of a pre-preg substrate after a quick etch to remove surface copper.

The surface of FIG. 6A is next subjected to a plasma clean step, which strips the resin from regions above the catalytic particles and the surface of the non-catalytic resin, leaving the catalytic particles 606 adhered to the surface of the non-catalytic pre-preg 602 as shown in FIG. 6B. FIG. 6C shows the result of placing the plasma cleaned surface of FIG. 6B into an electroless plating bath, which is done for a sufficient length of time to form a thin but continuous coat of electroless copper deposition 608, which initially forms over catalytic particles 606 and spreads across the top surface. FIG. 6D shows the addition of a pattern mask 610 over the electroless layer 608. Since an electroless layer now covers the surface of non-catalytic pre-preg 602, an electroplate operation may occur next to plate additional copper onto the exposed patterned areas, shown as trace 612 of FIG. 6E, which may deposit copper 612 to a level below or above mask 610. A mask strip operation is shown in FIG. 6F, which removes pattern mask 610, leaving copper trace 612 and electroless copper layer 608. FIG. 6G shows the results of a quick etch, which removes the thin layer of electroless copper 608 and an equal amount of the surface of trace 612, leaving behind a trace comprising a homogeneous trace comprising electroplated copper 612 and the underlying electroless copper deposition 608, thereby providing traces.

Figure 7A:
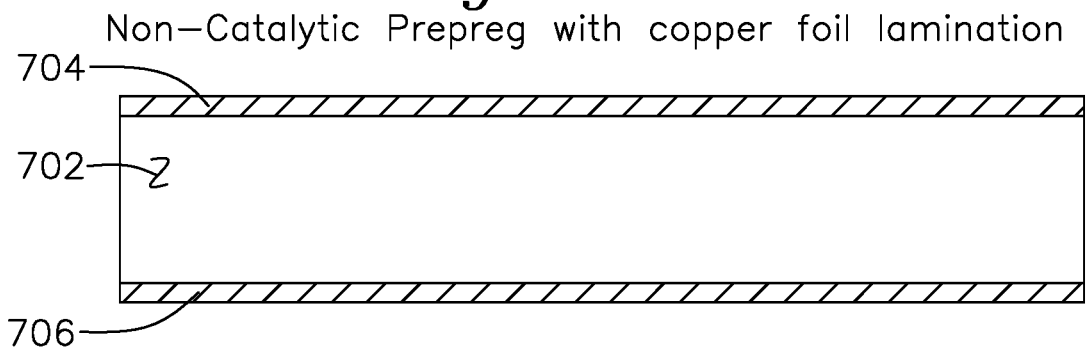
FIG. 7A shows a section view of a non-catalytic pre-preg with foil lamination.
Figure 7B:
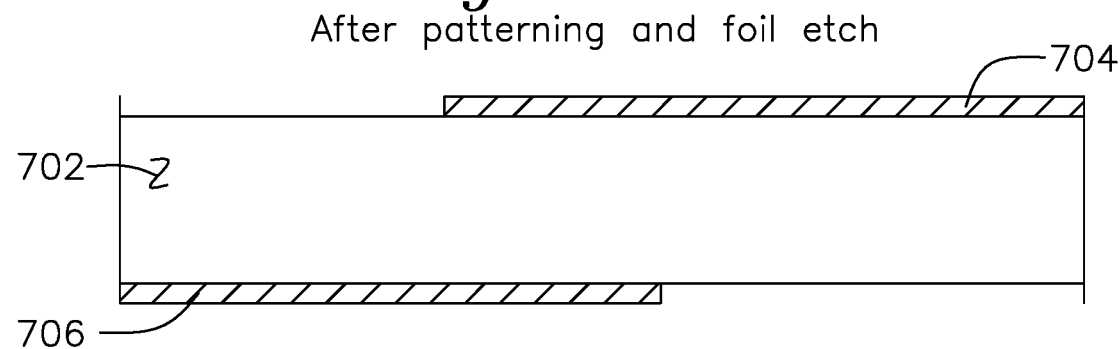
FIG. 7B shows a section view of an etched non-catalytic pre-preg after patterning.
Figure 7C:
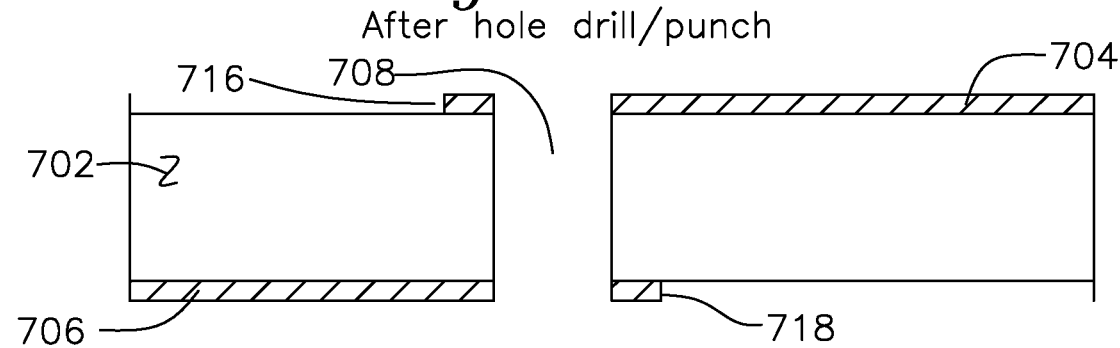
FIG. 7C shows a section view of a non-catalytic pre-preg after a hole is drilled.
Figure 7D:
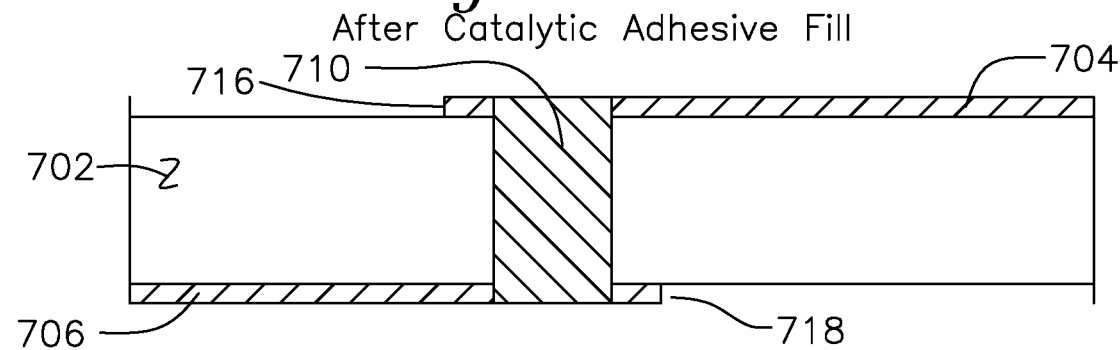
FIG. 7D shows a section view of a non-catalytic pre-preg after filling a hole with catalytic filler.
Figure 7E:
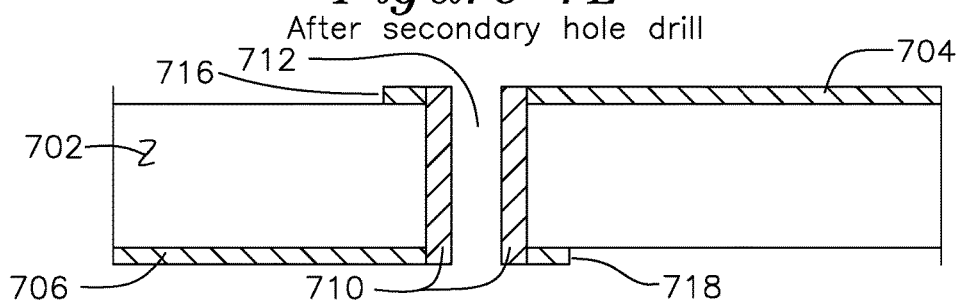
FIG. 7E shows a section view of a non-catalytic pre-preg after drilling of a second annular hole.
Figure 7F:
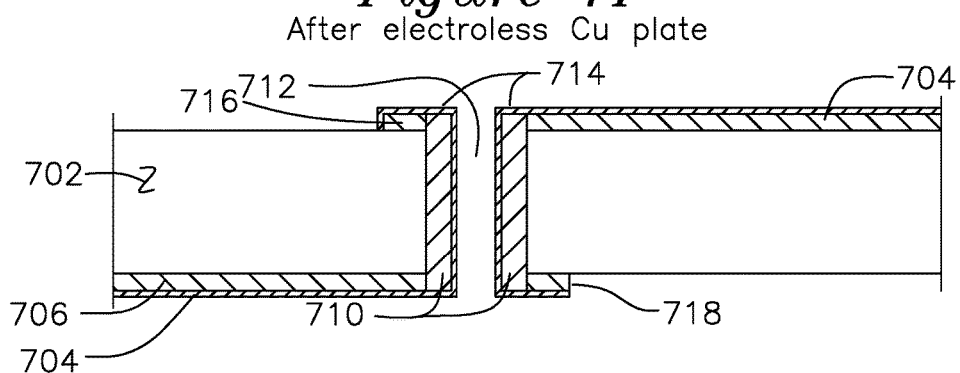
FIG. 7F shows a section view of a non-catalytic pre-preg after electroless plating of an annular hole.
Figure 7G:
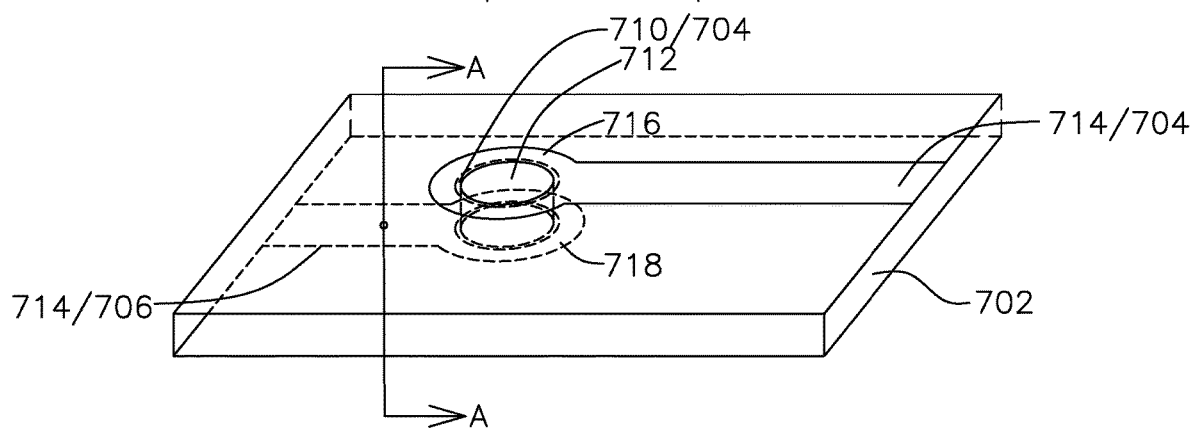
FIG. 7G shows a perspective transparent view of a via formed using the process of FIGS. 7A to 7F.

The series of FIGS. 7A to 7G show section views for a series of steps for forming a via in a conventional non-catalytic pre-preg 702 with upper foil lamination 704 and lower foil lamination 706. FIG. 7G shows a perspective view of the finished via, whereas FIGS. 7A to 7F are section views through A-A of FIG. 7G at the end of various intermediate processing steps.

FIG. 7B shows a section view of the upper layer 704 and lower layer 706 after patterning, where the trace 704 is to be connected to trace 706 on the opposite surface of the non-catalyst dielectric 702. FIG. 7B shows a via hole 708, which may be formed by punching or drilling, the hole 708 is positioned in the center of the annular ring of a pad 716 formed by the upper trace 704 and a pad 718 formed by lower trace 706. FIG. 7D shows a catalytic filler 710 such as a formulation for plugged vias with catalytic particles. The catalytic filler 710 is typically a thick fluid, with a viscosity in the range of 70,000-80,000 centipoise (cP), which is placed in the via aperture 708 of FIG. 7C, and FIG. 7E shows a secondary hole 712 which is drilled in the catalytic filler 710, which exposes the catalytic filler particles which are present in catalytic filler 710, thereby making the catalyst available for electroless plating operations. An electroless copper deposition step follows, and the electroless copper Cu++ forms a conductive deposition layer 714 over the top trace 704, annular ring top pad 716, through secondary hole 712 with catalytic particles exposed, over lower pad 718, and over lower trace 706, which completes the electrical circuit from upper trace 704 to lower trace 704 through via structure 710/714. As is clear to one skilled in the art, although an annular ring conductor is shown on each connecting surface, it is possible for the trace to connect directly into the via with or without an annular ring.

Figure 8A:
FIG. 8A shows a section view of a non-catalytic pre-preg laminate.
Figure 8B:
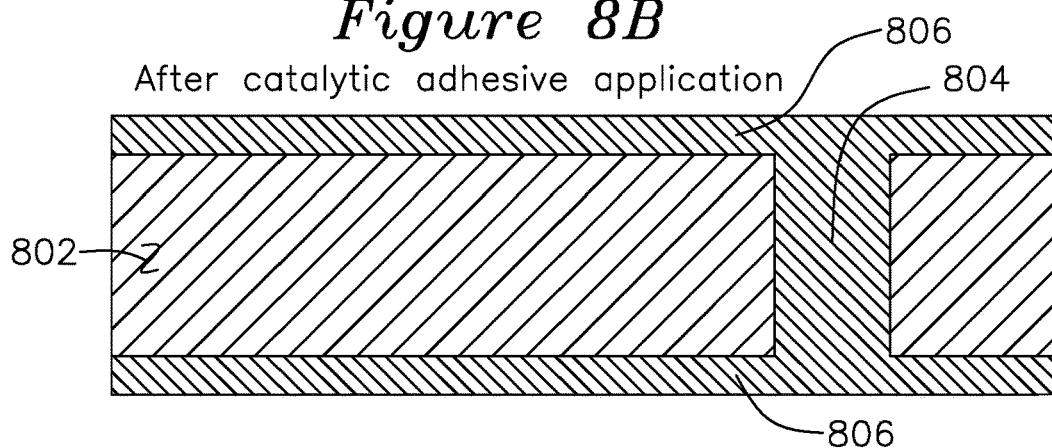
FIG. 8B shows FIG. 8A after application of a catalytic adhesive.
Figure 8C:
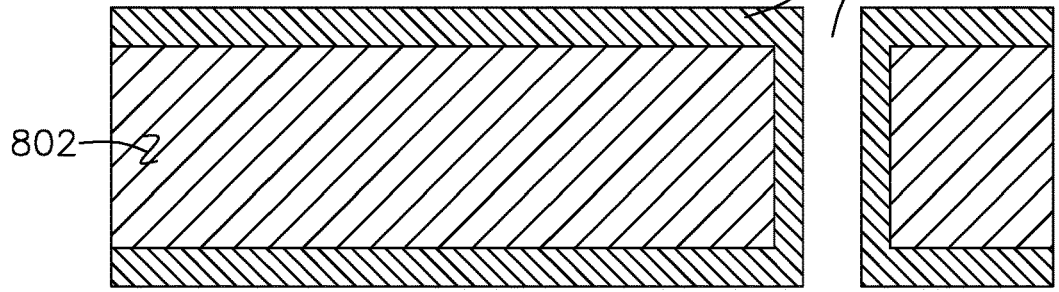
FIG. 8C shows FIG. 8B after a hole drill/punch operation.
Figure 8D:
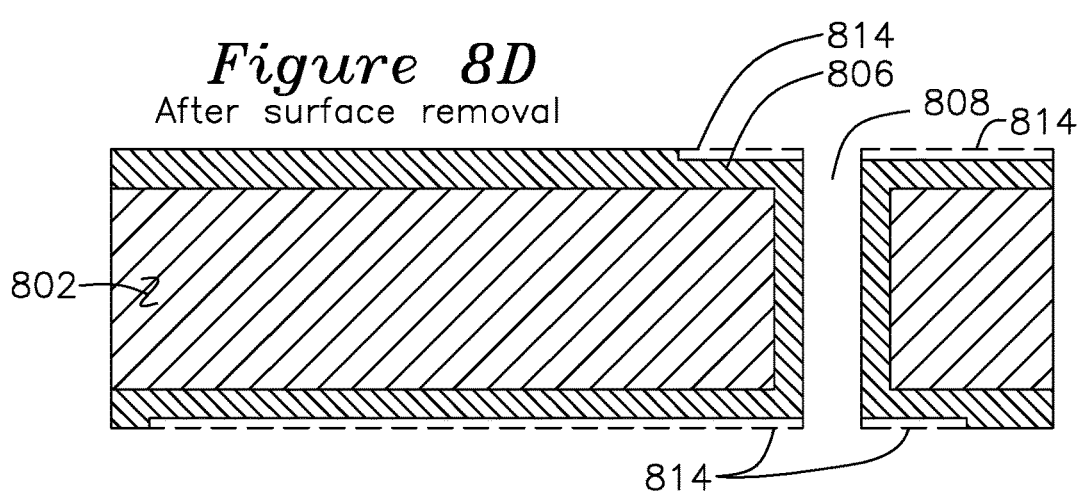
FIG. 8D shows FIG. 8C after a surface removal operation.
Figure 8E:
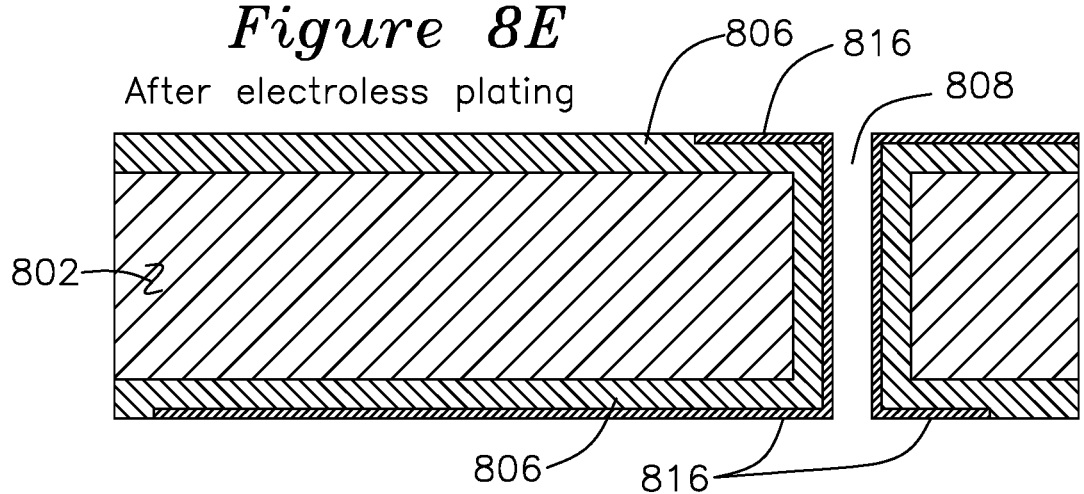
FIG. 8E shows FIG. 8D after an electroless plating operation.

FIG. 8A shows another method for electroless plating of traces onto a laminate, using a non-catalytic substrate or pre-preg 802, with optional hole 804 drilled or punched for layer to layer connectivity. FIG. 8B shows the application of catalytic adhesive 806, such as with a squeegee, screen printing, a stencil, or any other methods as previously described for FIG. 6A. Hole 804 is also filled with catalytic adhesive 806 in this coating operation. FIG. 8C shows secondary drilling 808 in the annular ring of hole 804, which activates the catalytic adhesive 806 in the drilled hole 808 by exposing the catalytic particles. FIG. 8D shows the removal 814 of surface layer 806 sufficient to expose the catalytic particles for forming electroless plated conductive traces, pads, and vias. FIG. 8E shows the completion of electroless plating, with copper 816 plated onto the catalytic adhesive which has been drilled, etched, or otherwise removed. Planarization may optionally be performed, or soldermask applied, as was described for FIG. 5D. In certain applications such as high frequency applications where dielectric loss tangent is critical, it may be desirable to use heterogeneous mixtures of non-catalytic laminate 802, such as PTFE, with a resin based catalytic laminate. In this case, it may be necessary to roughen the surface of a non-catalytic laminate 802 such as PTFE using plasma etching, chemical etching, or other methods known in the prior art for breaking long chain polymer molecules, thereby providing better adhesion for the catalytic adhesive at the catalytic adhesive/PTFE boundary. In one example of the invention, the PTFE non-catalytic substrate 802 is homogeneous PTFE, in another example it is a laminate, and in either case, the substrate 802 may or may not include fiber (such as glass fiber) reinforcement.

Figure 9A:
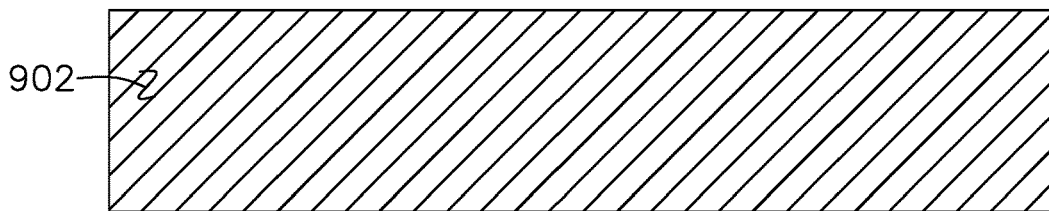
FIGS. 9A, 9B, 9C, 9D, and 9E show various stages of a section view of a catalytic adhesive applied over a catalytic laminate, which is drilled, etched, electroless plated, and planarized.
Figure 9B:
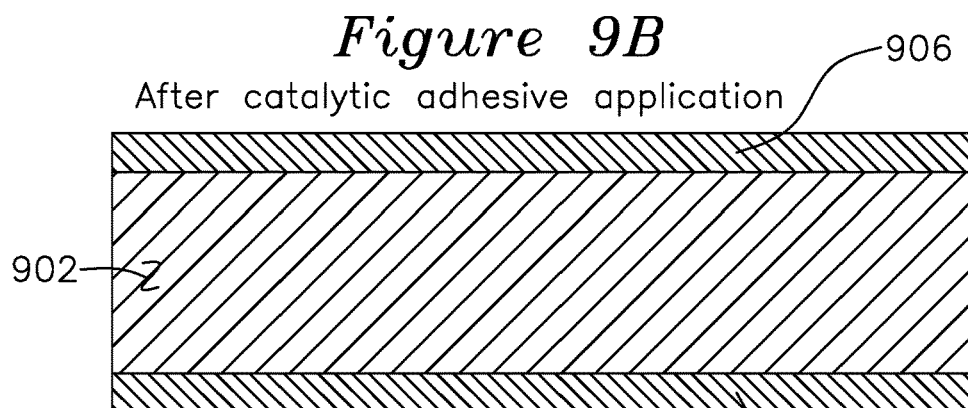
Figure 9C:
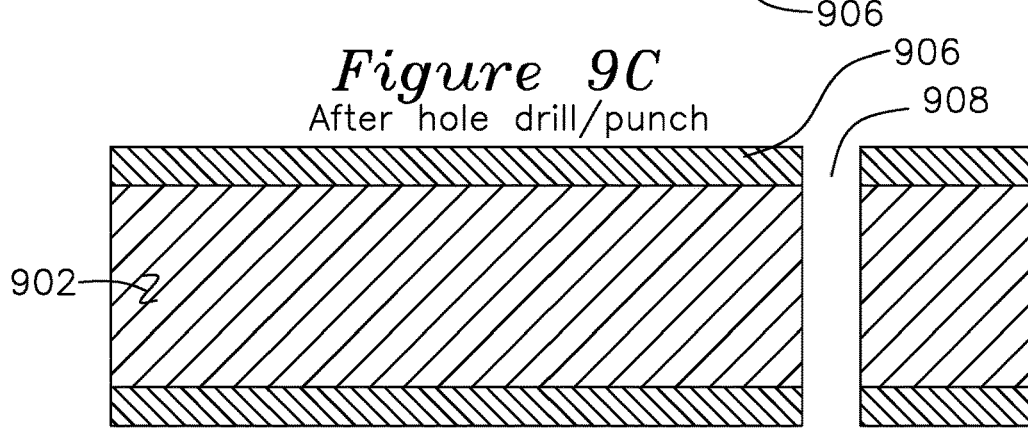
Figure 9D:
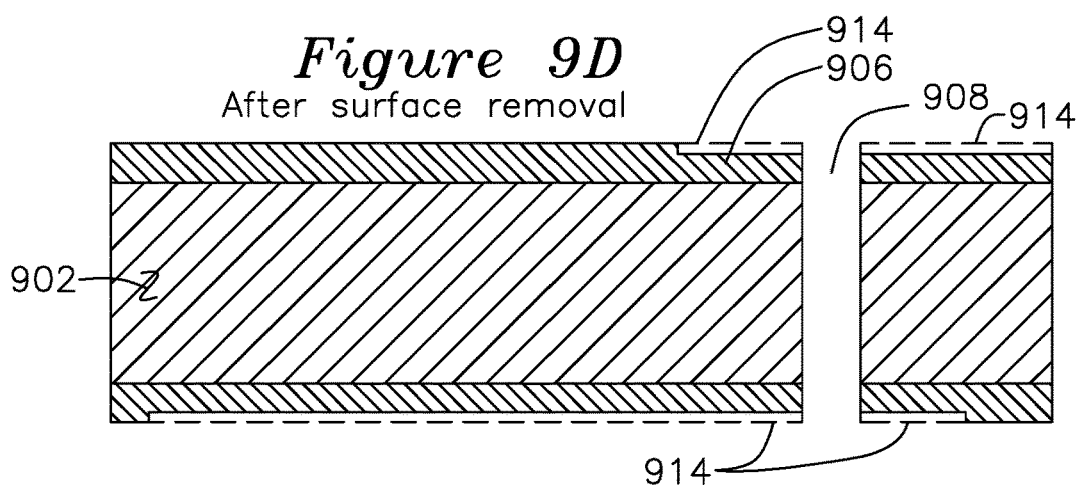
Figure 9E:
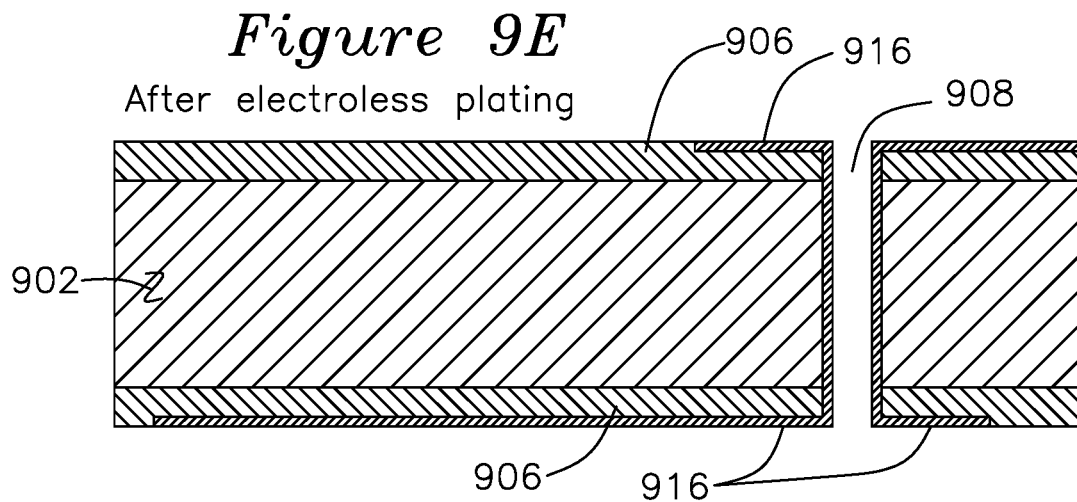

A variant of the laminate structure of FIGS. 8A through 8E is shown in FIGS. 9A to 9E, with the use of catalytic adhesive 906 over a catalytic laminate 902. There are several advantages to this approach. One advantage is the application of catalytic adhesive 906 does not require the through holes 908 be pre-drilled prior to application of catalytic adhesive as in 804 of FIG. 8A. Another advantage is that the resin rich surface can be formed by the catalytic adhesive 906 rather than the catalytic substrate 904, so that the catalytic particles of substrate 902 need not have an exclusion zone near the surface as was shown in FIG. 4, as this is now provided by the catalytic adhesive 906 applied to one or both sides of the substrate 902. FIG. 9C shows a section view after hole 908 is drilled, step 9D shows the surface removal 914, and FIG. 9E shows the electroless plating 916 using the previously described methods.

The preceding description is only to provide examples of the invention for understanding the underlying mechanisms and structures used, and is not intended to limit the scope of the invention to only the particular methods or structures shown. For example, the sequences of FIGS. 5A to 5E and 6A to 6G show a single sided construction with the trace channels cut on first surface only, whereas the same structures and methods can be applied to the second surface 505 without loss of generality, as the electroless plating step can be applied to channels or exposed catalyst on both sides of the board in a single step. Additionally, layers fabricated as in FIGS. 5A to 5E, 6A to 6G, 8A to 8E, 9A to 9E, and vias of FIG. 7A to 7F can be formed on individual layers which are subsequently laminated together into a single board with mixed layers of catalytic pre-preg and non-catalytic pre-preg, and the scope of claims related to "multilayer PCB" are to be interpreted to include such constructions. Similarly, although the trace structure and via structures of FIGS. 5A to 5E, 6A to 6G, 8A to 8E, and 7A to 7F are shown in combination as they would normally occur on a PCB, these examples are only for illustration, and are not intended to limit the invention to these constructions. For example, a mounting hole for a through hole component with no electrical connection could be formed without a connecting trace or annular ring according to the novel aspects of the process.

In the present specification, "approximately" is understood to mean less than a factor of 4 greater or smaller, "substantially" is understood to mean less than a factor of 2 greater or smaller. "Order of magnitude" of a value includes the range from 0.1 time the values to 10 times the value.

Certain post-processing operations are not shown which are generic to printed circuit board manufacturing, and may be performed using prior art methods on boards produced according to the novel process. Such operations include tin plating for improved solder flow, gold flash for improved conductivity and reduced corrosion, soldermask operations, silkscreening information on the board (part number, reference designators, etc.), scoring the finished board or providing breakaway tabs, etc. Certain of these operations may produce improved results when performed on planarized boards of certain aspect of the present invention. For example, silkscreened lettering over traces or vias traditionally breaks up because of trace and via thickness over the board surface, whereas these operations would provide superior results on a planarized surface.

We claim:
1. A circuit board comprising:
a catalytic dielectric having at least one surface, the catalytic dielectric having catalytic particles dispersed in a resin, the catalytic particles an exclusion depth below the at least one surface such that electroless plating only occurs where catalytic particles are exposed by removing the at least one surface of the catalytic dielectric to at least the exclusion depth below the at least one surface;
channels formed in the catalytic dielectric below the exclusion depth on at least one surface of the catalytic dielectric;
apertures formed through the catalytic dielectric;
electroless copper plated in the channels and apertures, thereby electrically connecting channels with copper in one surface to channels with copper on an opposite surface.

2. The circuit board of claim 1 where the catalytic particles are homogeneous.

3. The circuit board of claim 2 where the catalytic particles contain at least one of: palladium (Pd), platinum (Pt), rhodium (Rh), iridium (Ir), nickel (Ni), gold (Au), silver (Ag), cobalt (Co), or copper (Cu), or other compounds or salts thereof.

4. The circuit board of claim 1 where the catalytic particles are heterogeneous.

5. The circuit board of claim 1 where at least one of the catalytic particles is a filler coated with a catalyst.

6. The circuit board of claim 5 where the filler is at least one of: a clay mineral, a hydrous aluminum phyllosilicate, silicon dioxide, kaolinite, polysilicate, a member of the kaolin or china clay family, or a high temperature plastic.

7. The circuit board of claim 5 where the catalyst is at least one of: palladium (Pd), platinum (Pt), rhodium (Rh), iridium (Ir), nickel (Ni), gold (Au), silver (Ag), cobalt (Co), or copper (Cu), or other compounds or salts thereof.

8. The circuit board of claim 4 where said catalytic particle is silicon dioxide or kaolin coated with a catalytic material.

9. The circuit board of claim 1 where said catalyst is palladium.

10. The circuit board of claim 1 where the particle size is on the order of 3 u or less than 3 u.

11. The circuit board of claim 1 where the ratio of the catalytic particles to the resin by weight is in the range 8% to 16%.

12. The circuit board of claim 1 where the catalytic dielectric contains a glass fiber fabric.

13. The circuit board of claim 1 where the majority of the catalytic particles have a size smaller than 25 u.

14. A method for making a circuit layer on a catalytic dielectric having at least one surface, the catalytic dielectric having catalytic particles dispersed in a resin, the catalytic particles an exclusion depth below the at least one surface such that electroless plating only occurs where catalytic particles are exposed by removing the at least one surface of the catalytic dielectric to at least the exclusion depth below the at least one surface, the method comprising:
forming channels in the catalytic dielectric below the exclusion depth on at least one surface of the catalytic dielectric;
forming apertures through the catalytic dielectric;
immersing the catalytic dielectric with channels and apertures in electroless copper until copper plates onto the channels and apertures, thereby electrically connecting channels with copper in one surface to channels with copper on an opposing surface.

15. The method of claim 14 where said catalytic particles are at least one of: palladium (Pd), platinum (Pt), rhodium (Rh), iridium (Ir), nickel (Ni), gold (Au), silver (Ag), cobalt (Co), or copper (Cu), or compounds or salts thereof.

16. The method of claim 14 where said channels are formed using at least one of: laser cutting, mechanical abrasion, mechanical cutting, chemical or plasma etching.

17. The method of claim 14 where said catalytic particles are heterogeneous.

18. The method of claim 17 where said catalytic particle comprises a filler coated with a catalyst.

19. The method of claim 18 where said filler is at least one of: a clay mineral, a hydrous aluminum phyllosilicate, silicon dioxide, kaolinite, polysilicate, a member of the kaolin or china clay family, or a high temperature plastic.

20. The method of claim 18 where said catalytic particle size is on the order of 3 u or less than 3 u.

21. The method of claim 18 where said catalytic particle is silicon dioxide or kaolin coated with a catalytic material.

22. The method of claim 18 where said catalyst is palladium.

23. The method of claim 18 where said catalyst is at least one of: palladium (Pd), platinum (Pt), rhodium (Rh), iridium (Ir), nickel (Ni), gold (Au), silver (Ag), cobalt (Co), or copper (Cu), or other compounds or salts thereof.

24. The method of claim 14 where the ratio of said catalytic particles to said resin by weight is in the range 8% to 16%.

25. The method of claim 14 where said catalytic particles are homogeneous.

26. The method of claim 25 where said catalyst is palladium.

27. The method of claim 25 where said catalyst is at least one of: palladium (Pd), platinum (Pt), rhodium (Rh), iridium (Ir), nickel (Ni), gold (Au), silver (Ag), cobalt (Co), or copper (Cu), or other compounds or salts thereof.

28. The method of claim 14 where the resin includes a glass cloth.

29. The method of claim 14 where the majority of said catalytic particles by count have a size smaller than 25 u.

* * * * *